United States Patent [19]

Yakushiji et al.

[11] Patent Number: 4,943,835
[45] Date of Patent: Jul. 24, 1990

[54] SEMICONDUCTOR DEVICE INCLUDING PROTECTING MOS TRANSISTOR

[75] Inventors: Shigenori Yakushiji, Yokohama; Kouji Jitsukata, Kawasaki, both of Japan

[73] Assignee: Kabushiki Kaisha Toshiba, Kawasaki, Japan

[21] Appl. No.: 253,364

[22] Filed: Sep. 29, 1988

Related U.S. Application Data

[63] Continuation of Ser. No. 927,114, Nov. 5, 1986, abandoned.

[30] Foreign Application Priority Data

Nov. 22, 1985 [JP] Japan .................... 60-261274

[51] Int. Cl.[5] .................. H01L 29/78; H01L 29/74
[52] U.S. Cl. .................. 357/23.13; 357/38; 357/41; 357/13
[58] Field of Search ............. 357/23.13, 13, 38, 41

[56] References Cited

U.S. PATENT DOCUMENTS 4,492,974  1/1985  Yoshida et al. .................... 357/41
4,509,067  4/1985  Minami et al. .................... 357/41
4,602,266  7/1986  Coe ................................ 357/20

FOREIGN PATENT DOCUMENTS 2080988  11/1971  France ............................. 357/13
1303385   1/1973  United Kingdom ................. 357/13

OTHER PUBLICATIONS

Japanese Patent Disclosure (KOKAI) No. 60-35571, "Semiconductor Device", Aug. 8, 1983, T. Suzuki et al.
Patent Abstracts of Japan, vol. 9, No. 212 (E-339) [1935], Aug. 29, 1985; & JP-A-60 74 678 (Toshiba K.K.) 26-04-1985.
Patent Abstracts of Japan, vol. 9, No. 154 (E-325) [1877], Jun. 28, 1985; & JP-A-60 35 571 (Sanken Denki K.K.) 23-02-1985.

Primary Examiner—Jerome Jackson, Jr.
Attorney, Agent, or Firm—Finnegan, Henderson, Farabow, Garrett, and Dunner

[57] ABSTRACT

A zero-cross thyristor comprises an n-type substrate region surrounded by a p-type region, a p-type base region formed in the n-type substrate region and surrounding an n-type inner region of the n-type substrate region, and a p-type floating region formed in the n-type inner region. An n-channel MOS transistor whose gate is connected to the floating region is formed in the p-type base region. A first p+-type diffusion region whose depth is less than that of the p-type base region is continuously formed in the p-type base region and the n-type inner region and a second p+-type diffusion region whose depth is also less than that of the p-type floating region. The distance between the first and second diffusion regions is set to a predetermined value for preventing the breakdown of the gate insulating layer of the MOS transistor.

4 Claims, 2 Drawing Sheets

SEMICONDUCTOR DEVICE INCLUDING PROTECTING MOS TRANSISTOR

This application is a continuation of application Ser. No. 927,114, filed Nov. 5, 1986 now abandoned.

BACKGROUND OF THE INVENTION

The present invention relates to a semiconductor device, such as a thyristor or a triac, including a protecting MOS transistor.

A zero-cross photo thyristor or a zero-cross photo triac, which is turned on only at a zero-cross time point at which an AC voltage applied between a cathode and an anode crosses a zero line or at a time point near the zero-cross time point, has been proposed. The zero-cross photo thyristor is not turned on upon incidence of light when the voltage applied between the anode and cathode is high, but is turned on upon incidence of light when the voltage is low and is near the zero-cross time point. In such a thyristor, noise generated during switching is significantly reduced. An example of a thyristor whose operation is controlled by an incorporated MOS transistor is disclosed in Japanese Patent Disclosure (Kokai) No. 58-105572. A semiconductor device in which a gate portion of the above MOS transistor is protected from a high voltage so as to allow the above thyristor or the triac to have a high withstand voltage is disclosed in Japanese Patent Disclosure No. 60-74678. FIG. 1 is a sectional view of a planar type thyristor having such a structure for protecting a gate portion.

The thyristor shown in FIG. 1 has a pnpn four-layered structure including n-type cathode region 1, n-type region 2, p-type base regions 3 and 4 (which are formed integrally or connected electrically) surrounding cathode region 1 and n-type region 2, n-type region 5 surrounding base regions 3 and 4, and p-type anode region 6 surrounding n-type region 5. N-type region 2 is short-circuited to base region 3 through wiring 7. Cathode region 1, n-type region 2, gate insulating layer 8 provided on cathode region 1, n-type region 2 and base region 3 between cathode region 1 and n-type region 2, and gate electrode 9 provided on gate insulating layer 8 constitute a MOS transistor. Cathode region 1 and n-type region 2 are electrically connected and disconnected according to an ON-OFF operation of the MOS transistor. P-type floating region 10 is formed in the inner region of n-type region 5 surrounded by base regions 3 and 4, and gate electrode 9 is connected to floating region 10.

An operation of the semiconductor device in FIG. 1 is as follows. Assume that a sine wave voltage is applied between anode electrode A and cathode electrode K, the anode is positive and the cathode is negative, and a voltage amplitude is high. In this state, the voltage between the anode and cathode is applied to a p-n junction between n-type region 5 and base region 3. When the voltage is applied in the manner described above and light becomes incident on a surface of the device in FIG. 1, a photo current is generated in base region 3. The thyristor is turned on by the photo current if not having a structure to be turned on near the zero-cross time point of the AC voltage. However, in the thyristor shown in FIG. 1, a channel is formed in a surface region of base region 3 between cathode region 1 and n-type region 2 according to the gate voltage. More specifically, a current path including wiring 7, n-type region 2, the above channel, cathode region 1, and cathode electrode K is formed from base region 3, and the photo current generated in base region 3 flows to cathode K. Therefore, the thyristor is prevented from being turned on when the AC voltage is high.

The thyristor is turned on when the voltage between the anode and cathode is low enough to be near the zero-cross time point. More specifically, a potential of anode electrode A is supplied to gate electrode 9 through floating region 10, and a potential of cathode electrode K is supplied to the channel. Accordingly, when the voltage between the anode and cathode is lower than threshold voltage Vth of the MOS transistor, the channel which electrically connects cathode regions 1 and n-type region 2 is not formed. When the channel is not formed as described above, the thyristor is turned on by the photo current generated in base region 3. Once the thyristor is turned on, the MOS transistor is kept in an off state since the voltage between the anode and cathode does not rise over the forward voltage drop of the thyristor.

The semiconductor device (including a thyristor or a triac) shown in FIG. 1 has the following problems. More specifically, when a thyristor, a triac, or the like has a high withstand voltage, a high voltage is applied between the anode and cathode. Therefore, the MOS transistor must be prevented from breakdown by the high voltage. For this purpose, a structure which limits the voltage applied to the gate electrode below a predetermined value has been proposed. More specifically, a p-type floating region 10 surrounded by base regions 3 and 4 is provided such that a depletion layer which is generated between p-type base regions 3 and 4 and n-type region 5 gradually extends as the voltage between the anode and cathode becomes high and at last reaches floating region 10, thereby limiting the voltage applied to gate electrode 9 at a predetermined value. The voltage between the anode and cathode when the depletion layer reaches floating region 10 is called a punch-through starting voltage.

In order to control the above punch-through starting voltage precisely, the following three factors are present. That is, (1) impurity concentration of n-type region 5, (2) distances l between base regions 3 and 4 and floating region 10, and (3) surface impurity concentrations of base regions 3 and 4 and floating region 10. Since factor (1) is normally determined by the other conditions, the controls of factors (2) and (3) are important. Factors (2) and (3) are controlled by the diffusion length in the lateral direction of base regions 3 and 4 and floating region 10.

As for a thyristor or a triac with a high withstand voltage, a diffusion depth of base regions 3 and 4 must be about 40 $\mu$m. The diffusion depth, i.e., the diffusion length in the longitudinal direction and impurity can be controlled with relatively high precision. However, it is very difficult to control precisely the diffusion length in the lateral direction, so that the diffusion length in the lateral direction varies largely according to a manufacturing process. More specifically, in the structure of FIG. 1, distances l between base regions 3 and 4 and floating region 10 vary largely; so does the punch-through starting voltage. Therefore, control of distances l is important.

SUMMARY OF THE INVENTION

It is an object of the present invention to provide a semiconductor device incorporating a protecting MOS transistor to be turned on near the zero-cross voltage of a supply AC voltage, and having a structure capable of controlling a voltage applied to the gate electrode of the MOS transistor at a predetermined value with high precision and ease.

A semiconductor device including a protecting MOS transistor according to the present invention comprises a first semiconductor region of a first conductivity type connected to a first voltage supply source, a second semiconductor region of a second conductivity type which has a main surface and whose surface except for the main surface contacts the first semiconductor region; a third semiconductor region of the first conductivity type formed in the second semiconductor region and connected to a second voltage supply source, a fourth semiconductor region of the second conductivity type formed in the third semiconductor region and connected to a third voltage supply source; a fifth semiconductor region of the second conductivity type formed in the third semiconductor region and short-circuited to the third semiconductor region, a gate insulating layer continuously provided on one surface portion of the fourth semiconductor region, one surface portion of the fifth semiconductor region and the surface portion of the third semiconductor region between the fourth and fifth semiconductor regions, a gate control electrode provided on the gate insulating layer, a sixth semiconductor region of the first conductivity type formed in the inner region of the second semiconductor region surrounded by the third semiconductor region and connected to the gate control electrode, a first diffusion region of the first conductivity type having a depth less than that of the third semiconductor region, the first diffusion region being continuously formed in one portion of the inner region and in one portion of the third semiconductor region and contacting at least one portion of the surface junction between the third semiconductor region and the inner region of the second semiconductor region, and a second diffusion region of the first conductivity type having a depth less than that of the sixth semiconductor region and facing the first diffusion region, the second diffusion region being continuously formed in one portion of the inner region and in one portion of the sixth semiconductor region and contacting at least one portion of the surface junction between the sixth semiconductor region and the inner region of the second semiconductor region.

DETAILED DESCRIPTION OF THE PREFERRED EMBODIMENTS

Figure 2:
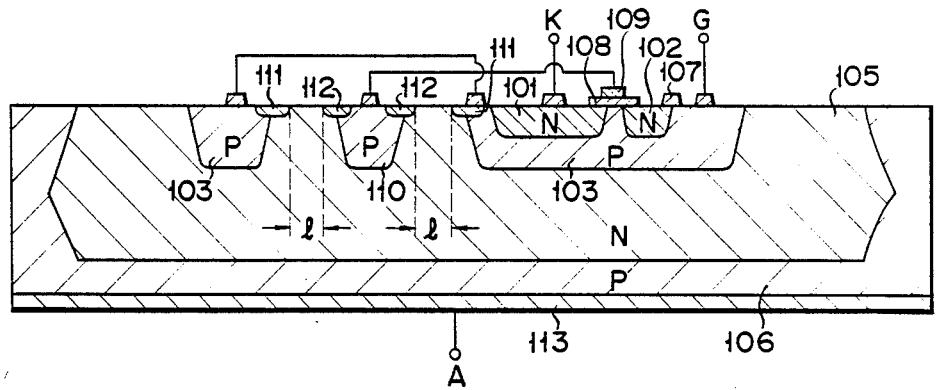
FIG. 2 is a sectional view of a zero-cross thyristor according to one embodiment of the present invention taken along the line II—II of FIG. 3.
Figure 3:
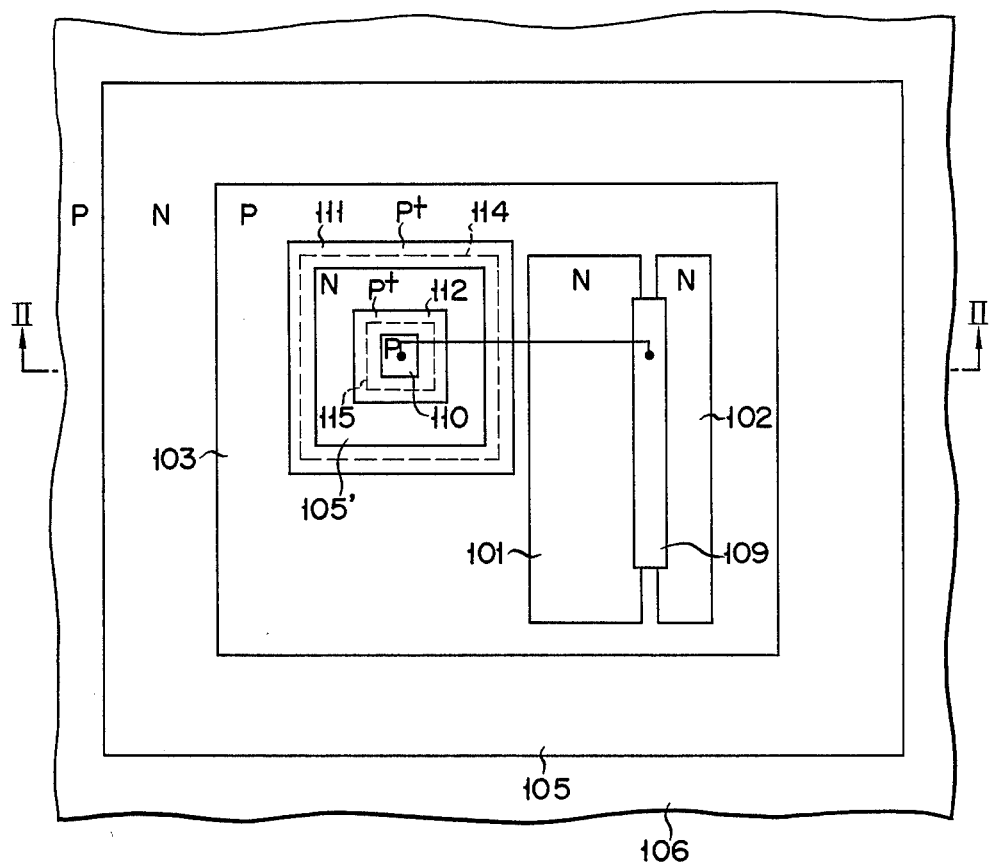
FIG. 3 is a plan view of FIG. 2.

In a thyristor shown in FIGS. 2 and 3, p-type first semiconductor region 106 is connected to first voltage (anode voltage) supply source A through anode electrode 113 provided on a surface opposite to a major surface. N-type second semiconductor region 105 has a main surface and the surface of region 105 except for the main surface contacts the first region 106. P-type third semiconductor region 103 (base region) is formed in second region 105 so as to surround inner region 105' of second region 105. N-type fourth semiconductor region 101 (cathode region) and n-type fifth semiconductor region 102 are provided in third region 103. Fifth region 102 is short-circuited to base region 103 by short circuit wiring 107. Base region 103 is connected to second voltage supply source G (base voltage supply source). The base voltage is not supplied when the thyristor is turned on upon incidence of light. Gate insulating layer 108 is formed on portions of cathode region 101 and fifth region 102 and the upper portion of base region 103 between cathode region 101 and fifth region 102, and gate control electrode 109 is formed on gate insulating layer 108. P-type sixth region 110 (floating region) is formed in inner region 105' of n-type second region 105. Floating region 110 is connected to gate control electrode 109. Over the entire area of surface junction 114 between base region 103 and inner region 105', p-type first diffusion region 111 is continuously formed in portions of base and inner regions 103 and 105'. Over the entire area of surface junction 115 between floating and inner regions 110 and 105', p-type second diffusion region 112 is continuously formed in portions of floating and inner regions 110 and 105' A distance between diffusion regions 111 and 112 is adjusted to be predetermined distance l. An impurity concentration of diffusion regions 111 and 112 is higher than that of base and floating regions 103 and 110, and depth of diffusion regions 111 and 112 is less than that of base and floating regions 103 and 110. In this embodiment, a surface impurity concentration of base and floating regions 103 and 110 is set to be $1 \times 10^{17}$ cm$^{-3}$, a depth thereof is set to be 40 μm, an impurity concentration of diffusion regions 111 and 112 is set to be $5 \times 10^{20}$ cm$^{-3}$, a depth thereof is set to be 3 μm, and an impurity concentration of second region 105 is set to be $1 \times 10^{14}$ cm$^{-3}$.

An operation of the thyristor shown in FIGS. 2 and 3 will now be described. Assume that anode voltage supply source A is positive, cathode voltage supply source K is negative, and the voltage between A and K is high. An anode potential is supplied to gate control electrode 109 through floating region 110, and a cathode voltage is supplied to the channel region between cathode region 101 and fifth region 102 through a p-n junction (forward p-n junction) between cathode region 101 and base region 103. Therefore, the MOS transistor (including cathode region 101 and fifth region 102, gate insulating layer 108, and gate control electrode 109) is turned on. Accordingly, a current path is formed from base region 103 to cathode voltage supply source K through wiring 107, fifth region 102, the channel region, and cathode region 101. Therefore, the thyristor is not turned on because a photo current generated in base region 103 upon incidence of light on the device surface flows to cathode voltage supply source K. However, when a voltage between the anode and cathode is small and a voltage applied between gate control electrode 109 and the channel region is lower than a threshold voltage of the MOS transistor, the MOS transistor is turned off, so that the thyristor is turned on by the photo current.

In the embodiment shown in FIGS. 2 and 3, in order to set the voltage between the anode and cathode, which turns on the MOS transistor, to be 5 to 6 V, insulating layer (SiO$_2$ layer) 108 is so formed as to have a thickness of about 1,500 Å. A breakdown voltage of the insulating layer with this thickness is normally 120 to 130 V. When the thyristor is prevented from being turned on, the anode-cathode voltage is applied directly to the insulating layer 108. At this time, when the anode-cathode voltage is increased, the depletion layer extends from base region 103 and first diffusion region 111 to floating region 110 and second diffusion region 112, so that the punch-through occurs. Thereafter, even when the anode-cathode voltage is increased, the voltage applied to gate control electrode 109 is not appreciably increased. It was found that in order to set the punchthrough starting voltage below 120 V, a distance between first and second diffusion regions 111 and 112 must be set to be about 30 μm.

Figure 1:
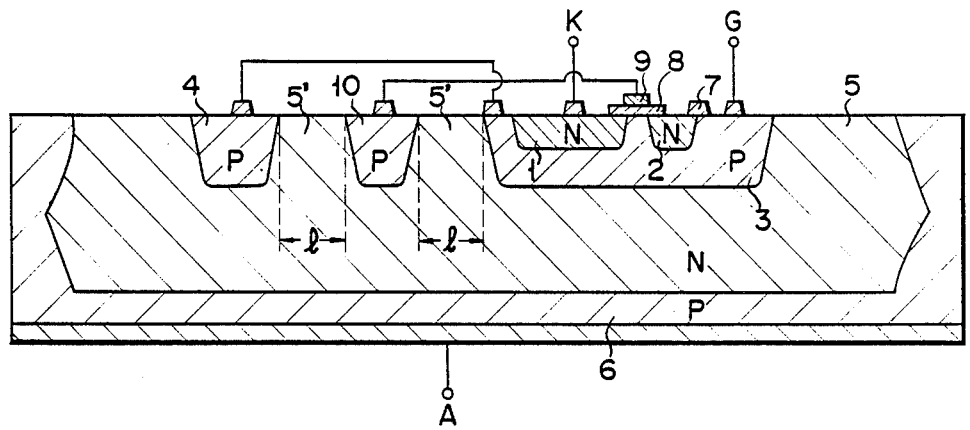
FIG. 1 is a sectional view of a conventional zero-cross thyristor.

In the prior art shown in FIG. 1, in order to obtain a thyristor with a withstand voltage of 600 V, the depths of base regions 3 and 4 and floating region 10 were set to be 40 μm, surface impurity concentrations thereof were set to be $1 \times 10^{17}$ cm$^{-3}$, and a distance between the base region and the floating region was set to be 100 μm on the mask. However, the punch-through starting voltage was between 60 to 90 V, and variations therein were very large. In the embodiment shown in FIGS. 2 and 3, a depth of base region 103 and floating region 110 is the same as that in FIG. 1, a depth of diffusion regions 111 and 112 is set to be 3.2 μm, a concentration thereof is set to be $5 \times 10^{17}$ cm$^{-3}$, distance l therebetween is set to be 25 μm on the mask. As a result, the punch-through starting voltage was in a range of 70±5 V, thereby extremely reducing the variations therein. Because of diffusion regions 111 and 112, the punch-through starting voltage could be easily and precisely controlled without changing the withstand voltage and the characteristics of the thyristor.

Figure 4:
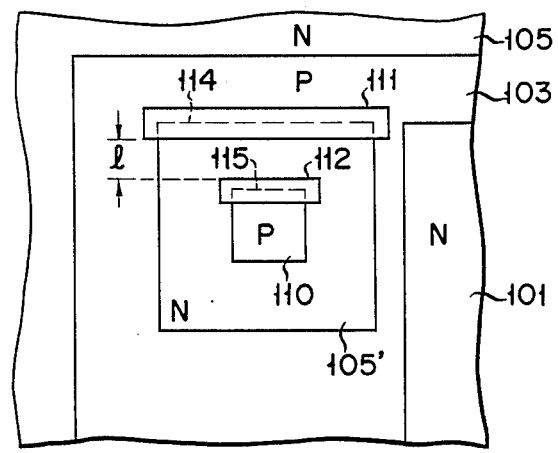
FIG. 4 is a part of a plan view of the zero-cross thyristor according to another embodiment of the present invention.

FIG. 4 is a part of a plan view of another embodiment of the present invention. In FIG. 2, first diffusion region 111 is provided along the entire surface junction between inner region 105' and base region 103, and second diffusion region 112 is provided along the entire surface junction between inner region 105' and floating region 110. However, first and second diffusion regions 111 and 112 may be provided along only the portions of both of the above mentioned surface junctions. This is because the punch through starting voltage is determined at a point where distance l is shortest.

Although the description has been made with reference to only a thyristor, it is obvious that the present invention can also be applied to a triac.

What is claimed is:

1. A semiconductor device including a protecting MOS transistor comprising:
   a first semiconductor region of a first conductivity type connected to a first voltage supply source;
   a second semiconductor region of a second conductivity type which has a main surface and whose surface except for said main surface contacts said first semiconductor region;
   a third semiconductor region of the first conductivity type formed in said second semiconductor region and connected to a second voltage supply source, said second semiconductor region having an island region surrounded by said third semiconductor region;
   a fourth semiconductor region of the second conductivity type formed in said third semiconductor region and connected to a third voltage supply source;
   a fifth semiconductor region of the second conductivity type formed in said third semiconductor region and short-circuited to said third semiconductor region;
   a gate insulating layer continuously provided on one surface portion of said fourth semiconductor region, one surface portion of said fifth semiconductor region and the surface portion of the third semiconductor region between said fourth and fifth semiconductor regions;
   a gate control electrode provided on said gate insulating layer;
   a sixth semiconductor region of the first conductivity type formed in said island region and connected to said gate control electrode to apply a voltage appearing on said sixth semiconductor region thereto, with a surface junction between said sixth semiconductor region and said island region;
   a first diffusion region of the first conductivity type having a depth less than that of said third semiconductor region, said first diffusion region being continuously formed in one portion of said island region and in one portion of said third semiconductor region and contacting at least one portion of the surface junction between said third semiconductor region and said island region of said second semiconductor region; and
   a second diffusion region of the first conductivity type having a depth less than that of said sixth semiconductor region and facing said first diffusion region, said second diffusion region being continuously formed in one portion of said island region and in one portion of said sixth semiconductor region and contacting at least one portion of the surface junction between said sixth semiconductor region and said island region; and
   a distance between said first diffusion region and said second diffusion region sufficient for providing that the voltage applied to the gate control electrode from the sixth semiconductor region is less than a breakdown voltage of the gate insulating layer.

2. A semiconductor device according to claim 1, wherein the impurity concentrations of said first and second diffusion regions are higher than those of said third and sixth semiconductor regions.

3. A semiconductor device according to claim 1, wherein said first diffusion region contacts an entire surface junction between said third semiconductor region and said island region and is continuously formed in one portion of said island region and in one portion of said third semiconductor region; and
   said second diffusion region contacts an entire surface junction between said sixth semiconductor region and said island region and is continuously formed in one portion of said island region and in one portion of said sixth semiconductor region.

4. A semiconductor device including a protecting MOS transistor comprising:
   a first semiconductor region of a first conductivity type connected to a first voltage supply source;
   a second semiconductor region of a second conductivity type which has a main surface and whose surface except for said main surface contacts said first semiconductor region;
   a third semiconductor region of the first conductivity type formed in said second semiconductor region and connected to a second voltage supply source, said second semiconductor region having an island region surrounded by said third semiconductor region;

a fourth semiconductor region of the second conductivity type formed in said third semiconductor region and connected to a third voltage supply source;

a fifth semiconductor region of the second conductivity type formed in said third semiconductor region and short-circuited to said third semiconductor region;

a gate insulating layer continuously provided on one surface portion of said fourth semiconductor region, one surface portion of said fifth semiconductor region and the surface portion of the third semiconductor region between said fourth and fifth semiconductor regions;

a gate control electrode provided on said gate insulating layer;

a sixth semicondecutor region of the first conductivity type formed in said island region and connected to said gate control electrode to apply a voltage appearing on said sixth semiconductor region thereto, with a surface junction between said sixth semiconductor region and said island region of said second semiconductor region;

a first diffusion region of the first conductivity type having a depth less than that of said third semiconductor region, said first diffusion region being continuously formed in one portion of said island region and in one portion of said third semiconductor region and contacting only one portion of a surface junction between said third semiconductor region and said island region of said second semiconductor region; and a second diffusion region of the first conductivity type having a depth less than that of said sixth semiconductor region and facing said first diffusion region, said second diffusion region being continuously formed in one portion of said island region and in one portion of said sixth semiconductor region and contacting only one portion of said surface junction between said sixth semiconductor region and said island region; and a distance between said first diffusion region and said second diffusion region sufficient for providing that the voltage applied to the gage control electrode from the sixth semiconductor region is less than a breakdown voltage of the gate insulating layer.

* * * * *